United States Patent

Kurosawa et al.

[11] Patent Number: 5,914,773
[45] Date of Patent: Jun. 22, 1999

[54] EXPOSURE APPARATUS AND METHOD USING PULSED LIGHT AND CHANGING MEANS TO CONTROL BOTH THE LIGHT INTENSITY AND LIGHT EMISSION TIMING

[75] Inventors: Hiroshi Kurosawa, Matsudo; Kunitaka Ozawa, Utsunomiya; Noriyasu Hasegawa, Utsunomiya; Keiji Yoshimura, Utsunomiya, all of Japan

[73] Assignee: Canon Kabushiki Kaisha, Tokyo, Japan

[21] Appl. No.: 08/668,459

[22] Filed: Jun. 25, 1996

[30] Foreign Application Priority Data

Jun. 26, 1995 [JP] Japan .................................. 7-159425

[51] Int. Cl.⁶ .......................... G03B 27/42; G03B 27/52; G03B 27/54; G03B 27/72
[52] U.S. Cl. ............................... 355/53; 355/55; 355/67; 355/71
[58] Field of Search ..................................... 356/399, 400, 356/401; 250/201.1, 548, 559.3, 442.1, 442.11; 355/53, 55, 67, 68, 69, 77, 50

[56] References Cited

U.S. PATENT DOCUMENTS

| 451,692 | 5/1891 | Michalik ................................. 354/412 |
| 3,823,318 | 7/1974 | Krause ................................. 250/214 P |
| 4,095,041 | 6/1978 | Aketagawa ................................. 355/53 |
| 4,676,630 | 6/1987 | Matsushita et al. . |
| 4,711,568 | 12/1987 | Torigoe et al. ............................ 355/68 |
| 4,748,477 | 5/1988 | Isohata et al. . |
| 4,749,867 | 6/1988 | Matsushita et al. . |
| 4,804,978 | 2/1989 | Tracy ....................................... 346/108 |
| 4,822,975 | 4/1989 | Torigoe .............................. 219/121.85 |
| 4,884,101 | 11/1989 | Tanimoto ................................... 355/68 |
| 4,947,047 | 8/1990 | Muraki ................................. 250/492.2 |
| 4,970,546 | 11/1990 | Suzuki et al. .............................. 355/53 |
| 4,974,919 | 12/1990 | Muraki et al. ............................ 350/6.6 |
| 4,998,134 | 3/1991 | Isohata et al. . |
| 5,008,703 | 4/1991 | Kawakami et al. . |
| 5,053,614 | 10/1991 | Yui et al. ................................. 250/205 |
| 5,063,582 | 11/1991 | Mori et al. . |
| 5,097,291 | 3/1992 | Suzuki ....................................... 355/69 |
| 5,107,275 | 4/1992 | Tsuruoka et al. ......................... 346/1.1 |
| 5,112,133 | 5/1992 | Kurosawa et al. . |
| 5,119,390 | 6/1992 | Ohmori ..................................... 355/53 |
| 5,142,156 | 8/1992 | Ozawa et al. . |
| 5,157,700 | 10/1992 | Kurosawa et al. . |
| 5,171,965 | 12/1992 | Suzuki et al. ......................... 219/121.6 |
| 5,172,402 | 12/1992 | Mizusawa et al. . |
| 5,182,615 | 1/1993 | Kurosawa et al. . |
| 5,191,374 | 3/1993 | Hazama et al. ............................ 355/43 |
| 5,231,291 | 7/1993 | Amemiya et al. . |
| 5,250,797 | 10/1993 | Sano et al. ............................... 250/205 |
| 5,473,412 | 12/1995 | Ozawa ....................................... 355/53 |
| 5,475,491 | 12/1995 | Shiozawa ................................. 356/394 |
| 5,484,311 | 1/1996 | Sakakibara et al. ....................... 355/53 |
| 5,491,534 | 2/1996 | Shiozawa ................................. 355/69 |
| 5,495,336 | 2/1996 | Nose et al. . |
| 5,498,878 | 3/1996 | Hasegawa et al. . |
| 5,526,093 | 6/1996 | Takahashi ................................. 355/53 |
| 5,567,928 | 10/1996 | Sano ....................................... 250/205 |
| 5,574,537 | 11/1996 | Ozawa ....................................... 355/71 |
| 5,617,181 | 4/1997 | Yanagihara et al. ...................... 355/46 |
| 5,621,499 | 4/1997 | Shiozawa ................................. 355/67 |
| 5,627,627 | 5/1997 | Suzuki ....................................... 355/68 |
| 5,644,383 | 7/1997 | Mori ......................................... 355/68 |

Primary Examiner—Richard Moses
Assistant Examiner—Shival Virmani
Attorney, Agent, or Firm—Fitzpatrick, Cella, Harper & Scinto

[57] ABSTRACT

An exposure apparatus and device manufacturing method having structure and steps for projecting, for scan exposure of a substrate through an original, a plurality of light pulses from a pulse light source to the substrate through the original, changing an emitted light intensity of light pulses from the pulse light source during the scan exposure, and changing timing of light emission from the pulse light source during the scan exposure, whereby both the emitted light intensity and the timing of light pulses may be controlled during the scan exposure.

21 Claims, 14 Drawing Sheets

EXPOSURE APPARATUS AND METHOD USING PULSED LIGHT AND CHANGING MEANS TO CONTROL BOTH THE LIGHT INTENSITY AND LIGHT EMISSION TIMING

FIELD OF THE INVENTION AND RELATED ART

This invention relates to an exposure apparatus and, more particularly, to a scan type exposure apparatus with a light source such as an excimer laser, for use in manufacture of devices such as semiconductor devices (e.g., IC or LSI), liquid crystal devices, image pickup devices (e.g., CCD) or magnetic heads, for example. In another aspect, the invention is concerned with a device manufacturing method which uses an exposure apparatus such as above.

Enlargement of scale of and reduction in size of an IC pattern has been required more and more. In order to meet the requirement of enlargement of scale, there has been developed a scan type exposure apparatus of slit scanning process, in which a mask and a wafer are scanningly moved relative to a slit-shaped illumination region in a timed relation to thereby achieve exposure of a wider area. Regarding the latter requirement of reduction in size, it can be met by reducing the wavelength of exposure light, and conventional Hg lamps which have been used as a light source are going to be replaced by excimer lasers which provide light of deep ultraviolet region.

An excimer laser is a light source of pulse light emission type wherein, at the maximum, to a pulse interval (spacing) of about 2.5 msec, the time period of actual light emission is about a few tens of nanoseconds. Also, it has a feature that, with respect to an externally applied control amount, the dispersion of emitted light intensities of pulses is large.

On the other hand, enlargement of scale of and reduction in size of an IC pattern has required more strict precision of control of pattern line width. Also, this necessitates more strict precision of control of non-uniformness of wafer exposure. For a 256 MDRAM chip, for example, a line width processing precision of 0.25 micron is necessary and, in that case, tolerable non-uniformness of exposure is estimated as about 1%.

It is known that, in a scan type exposure apparatus with a light source of an excimer laser, in order to hold the non-uniformness of exposure within a tolerable range, the charging voltage of excimer laser is changed in the exposure process to control the intensity of light to be emitted.

When emission of light of an excimer laser starts from a state wherein the emission is stopped, the intensity of emitted light changes such as shown in FIG. 1. It is seen that, even though the control amount (emission interval, charging voltage and so on) is unchanged, the intensity of emitted light changes transitional in spike-like fashion. This is called "spike phenomenon". Such spike phenomenon deteriorates the exposure precision. The wafer exposure process may not be performed in the region where such spire phenomenon occurs. Alternatively, the excimer laser may be operated continuously to avoid occurrence of spike phenomenon. However, since the life time of a tube of an excimer laser is relatively short, the emitted light should be used efficiently. Also, emission of light should preferably be stopped in the period in which exposure shots are changed or in the period in which a mask and wafer alignment process is performed. If the light emission is stopped in the period in which exposure shots are changed, then it is necessary to control the intensity of light to be emitted while taking into account the transitional intensity change.

It is to be noted here that the term "continuous emission" used or to be used in this specification refers to repetitions of emission of pulse light with short periodicity.

The method of changing the charge voltage of an excimer laser to control the intensity of emitted light, described above, has a disadvantage that the controllable range of charge voltage is only 7%–8% of the charge voltage. This is very narrow. Further, there is a relation between the charge voltage and the dispersion of emitted light intensity such as shown in FIG. 2, wherein it is seen that the dispersion of emitted light intensity increases with decrease of charge voltage. It is therefore very difficult to completely avoid the spike phenomenon.

If the spike phenomenon is not completely avoided, then non-uniformness of exposure results. This is very disadvantageous since in recent device manufacture a very strict precision is required.

SUMMARY OF THE INVENTION

It is an object of the present Invention to provide an exposure apparatus by which precision of exposure process is assured even from start of emission of a laser.

In accordance with an aspect of the present invention, there is provided an exposure apparatus wherein an object is illuminated with plural light pulses emitted from a pulse light source which produces pulses of light whose intensities changes per pulse, wherein the apparatus is provided with emission light intensity controlling means for controlling the intensity of light pulse as well as light emission timing controlling means for controlling the timing of light pulse emission, and wherein the intensity of light pulse and the time moment of emission of light pulse are controlled during continuous emission of the pulse light source.

An exposure apparatus according to the present invention may be used in any of different ways of combination with a FB mechanism which serves to control a subsequent emission light intensity or a subsequent light emission moment on the basis of the intensity of light pulse just emitted, or with a FF mechanism which serves to control a subsequent emission light intensity or a subsequent light emission moment on the basis of a predicted value of intensity of light to be emitted subsequently, so that precise exposure is accomplished.

As an example, the emission light intensity controlling means and the light emission moment controlling means may be used selectively in accordance with a frequency component of changes in intensity of pulse light, to control the emission light intensity and light emission moment of a subsequent light pulse.

With an exposure apparatus according to the present invention, it is possible to produce devices such as semiconductor devices (e.g., IC or LSI), liquid crystal devices, image pickup devices (e.g., CCD) or magnetic heads, for example, very precisely.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

[First Embodiment]

Figure 3:
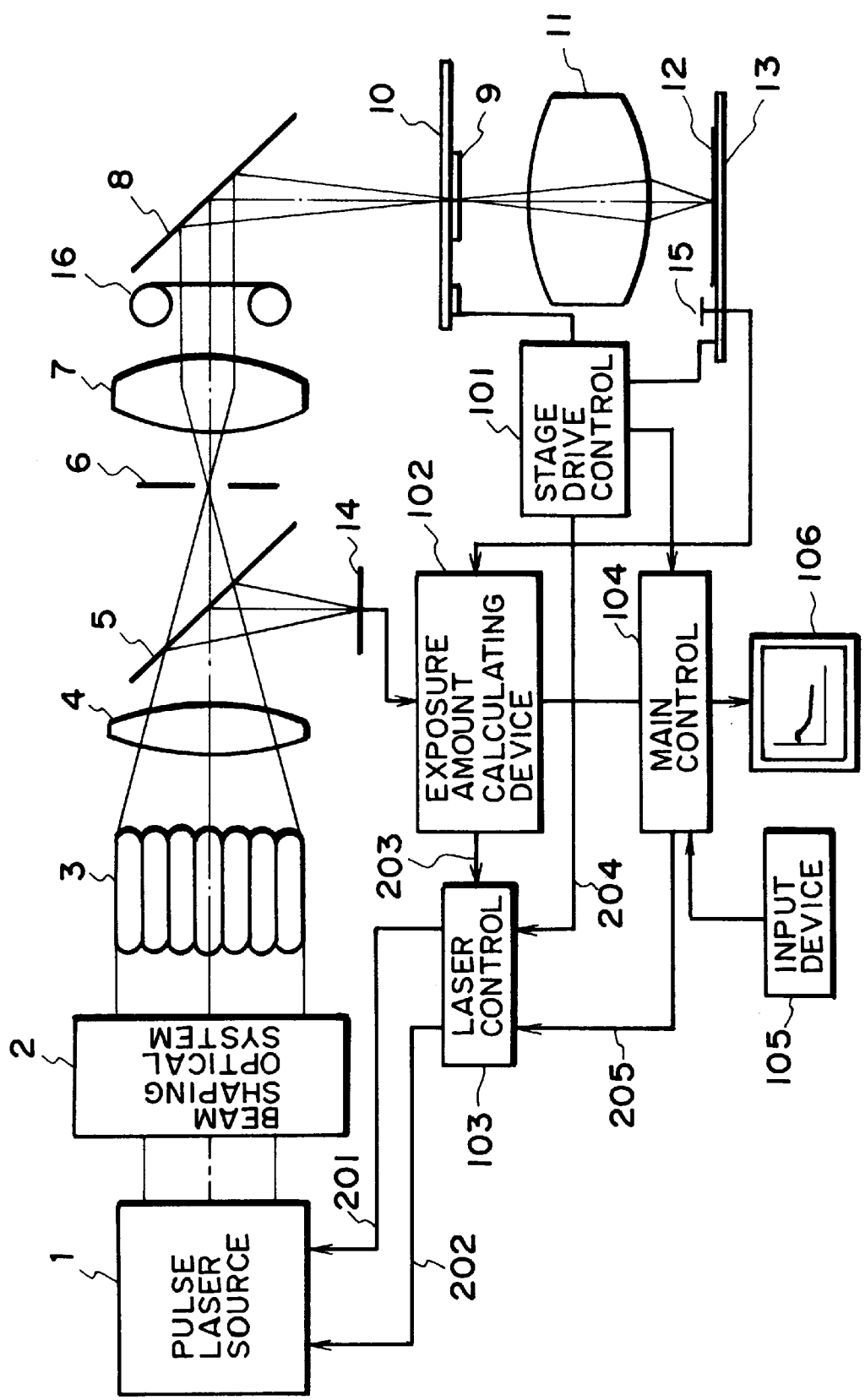
FIG. 3 is a schematic and diagrammatic view of a scan type exposure apparatus according to the present invention.

FIG. 3 illustrates an embodiment of the present invention which is applied to an exposure apparatus for manufacture of devices such as semiconductor devices (e.g., IC or LSI), liquid crystal devices, image pickup devices (e.g., CCD) or magnetic heads, for example.

Light from a pulse laser light source 1 such as an excimer laser, for example, which produces pulse light, is shaped by a beam shaping optical system 2 into a desired shape. The light is directed to a light entrance surface of an optical integrator 3 which comprises a fly's eye lens, for example. The fly's eye lens is provided by a combination of small lenses, and it serves to define a plurality of secondary light sources in the vicinity of a light exit surface thereof. Condenser lens 4 functions to illuminate a masking blade 6 in Kohler illumination fashion, with light from the secondary light sources of the optical integrator 3. A portion of pulse light divided by a half mirror 5 is directed to a first exposure amount detector 14. The masking blade 6 and a reticle 9 are disposed in an optically conjugate relationship with each other with respect to an imaging lens 7 and a mirror 8. Thus, the shape and size of an illumination region upon the reticle 9 is determined by the shape of the opening of the masking blade 6. In this embodiment, the illumination region upon the reticle 9 has a slit-like oblong shape wherein its widthwise direction is put on the scan direction of the reticle 9. Denoted at 11 is a projection lens which serves to project a circuit pattern, formed on the reticle 9, onto a wafer 12 in a reduced scale. Mounted on a wafer stage 13 is a second exposure amount detector 15 with which the laser exposure amount through the optical system can be monitored. Denoted at 16 is a high speed shutter.

Denoted at 101 is a stage drive control system for controlling a reticle stage 10 and the wafer stage 13 so that they are moved accurately at constant speeds and at a ratio the same as the projection magnification of the projection lens 10. Denoted at 102 is an exposure amount calculating device by which electric signals, provided by photoelectric conversion by the first and second exposure amount detectors 14 and 15, are transformed into logic values which are then applied to a main control system 104. Laser control system 103 serves to supply, to the excimer laser 1, a trigger signal 201 and a charge voltage signal 202 corresponding to a desired exposure amount, to thereby control the laser output and laser emission interval. The trigger signal 201 arid the charge voltage signal 202 are determined in accordance with parameters such as a current position signal 204 from the stage drive control system or hysteresis information from the main control system, for example. Denoted at 104 is the main control system which functions to control the stage drive control system 101, the exposure amount calculating device 102 and the laser control system 103, as a whole. By this main control system 104, an intensity designation signal 205 is applied to the laser control system 103, as a target value for the emission light intensity. Desired exposure amount is inputted into an input device 105 manually by an operator or automatically. The results of detection by the first and second exposure amount detectors 14 and 15 may be displayed at a display 106.

Figure 1:
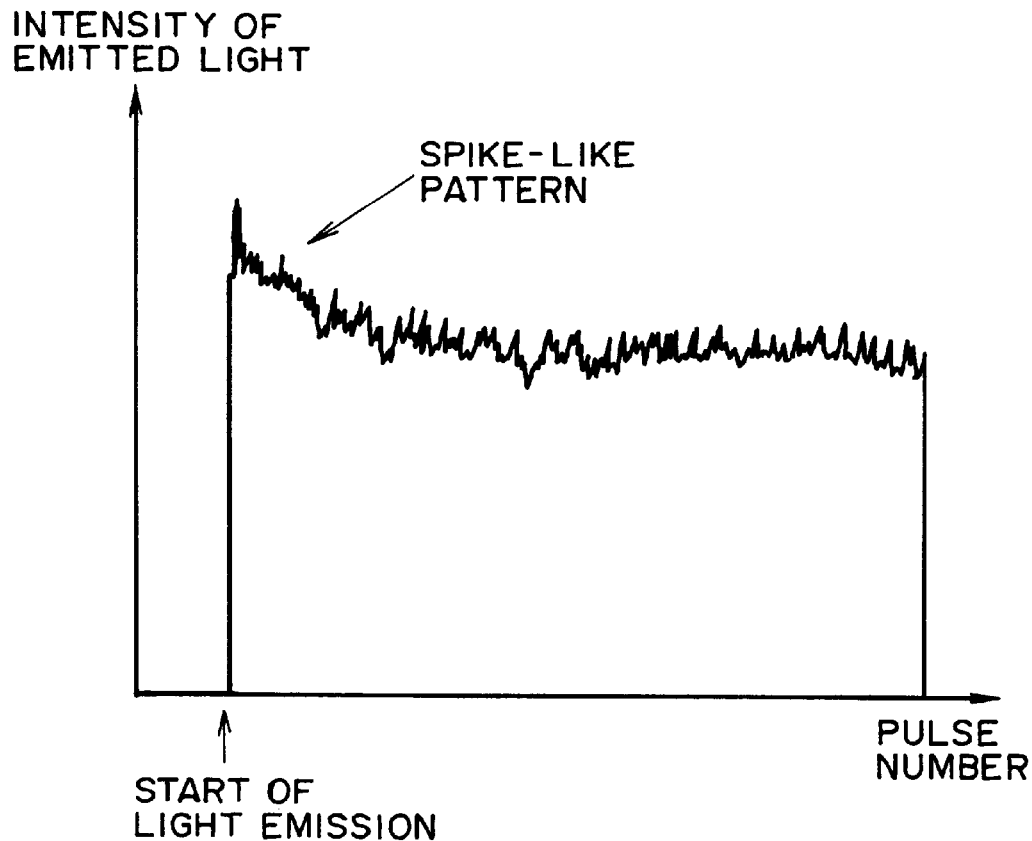
FIG. 1 is a graph for explaining transitional changes in intensity of an excimer laser light source from start of light emission.
Figure 2:
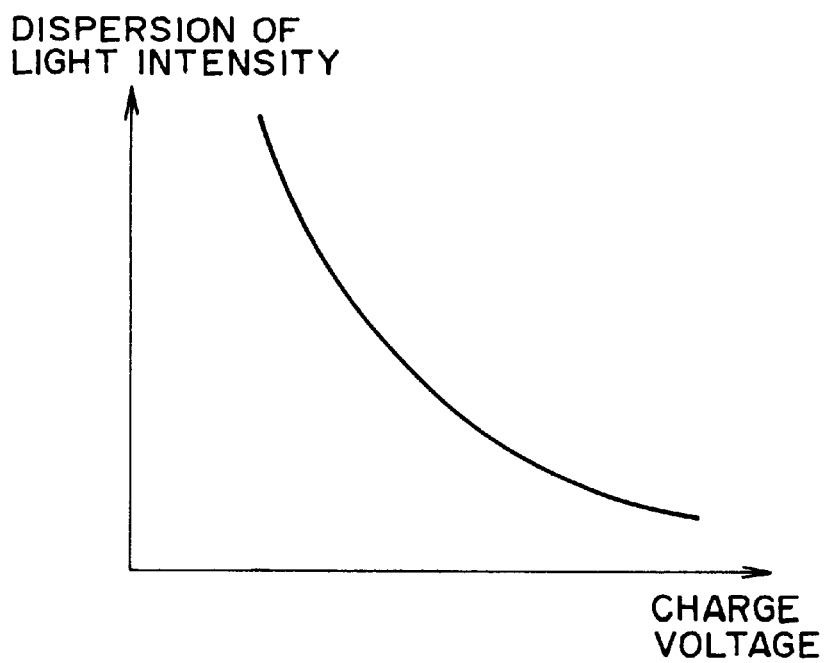
FIG. 2 is a graph for explaining the relation between charge voltage of a laser and dispersion of emitted light intensity.

The exposure apparatus of this embodiment operates so that, when dispersion of intensity of emitted light pulses supplied from the pulse laser source is large such as illustrated in FIG. 1 and there are a variety of frequency components, emission light intensity control and emission timing control may be selectively performed in accordance with the frequency components, to thereby accomplish uniformization of non-uniform exposure of a wafer.

Figure 4:
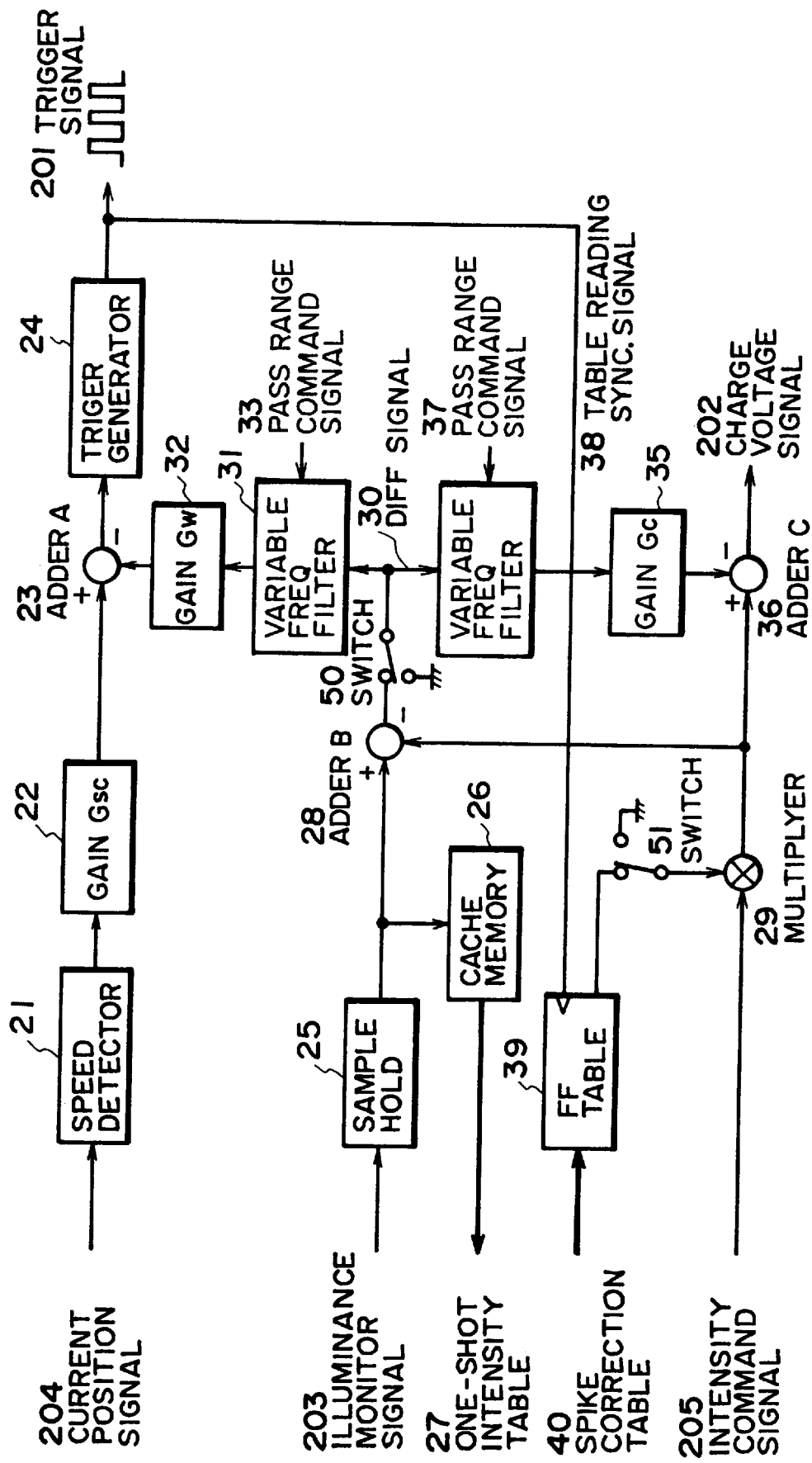
FIG. 4 is a schematic and diagrammatic view of a laser control system of the exposure apparatus of the FIG. 1 embodiment.

FIG. 4 schematically and diagrammatically shows the structure of the laser control system 103 of this embodiment.

Current position signal 204 which reflects the current position of or a target value for the wafer stage 13 is applied to a speed detecting means 21, in which it is transformed into a speed signal. The speed signal produced by the speed detecting means 21 is multiplied by a predetermined gain Gsc (22), whereby a reference value for determining the basic light emission interval of the laser light source 1 is provided. The resultant signal is applied to a notional adder B (23). The output of the adder B (23) is applied to an input of a trigger generator 24, whereby a trigger signal 201, in which the light emission interval is reflected to actual pulse spacing, is outputted.

The words "notional adder" means that only the function of an adder is sufficient. Thus, it may be accomplished either by a hardware or by a software.

Illuminance monitor signal 203 produced by the exposure amount calculating means 102 is latched by a sample hold circuit 25, and the intensity of emitted light is recorded in a cache memory 26. The cache memory 26 serves to record all the measured values of light intensities during the exposure process of one shot by scan exposure procedure. The data stored in the cache memory 26 is transferred to the main control system 104 as a one-shot period intensity measurement table 27. The output of the sample hold circuit 25 is applied on the other hand to an adder B (28) by which a difference with the output of a multiplier 29 is taken, such that a differential signal 30 is produced. The differential signal 30 is applied to a variable frequency filter 31 such as a low pass filter, for example. After being multiplied by a gain Gw (32), the signal is inputted into the adder A (23) in reversed phase. Denoted at 33 is a in passing range designation signal which is applied from the main control system 104.

With the feedback (FB) mechanism such as described above, it is possible to change the light emission timing in accordance with the variation component corresponding to the lower frequency of dispersion of emission light intensity. Thus, uniformization of non-uniform exposure attributable to the lower frequency component of dispersion of emission light intensity, can be accomplished by control of light emission timing, On the other hand, the differential signal 30 is applied to a variable frequency filter 34 having a passing range for a frequency region higher than that of the variable frequency filter 31. After being multiplied by a gain Gc (35), the signal is applied to a notional adder C (36) in reversed phase. Denoted at 37 is a passing range designation signal for the variable frequency filter 34 which signal is supplied from the main control system 104.

With the feedback mechanism described above, it is possible to change the emission light intensity in accordance with the variation component corresponding to the higher frequency of dispersion of emission light intensity. Thus, uniformization of non-uniform exposure attributable to higher frequency component of dispersion of emission light intensity can be accomplished.

The proportion and allocation of as well as interchange between light emission timing control and emission light intensity control may be controlled by changing the set allocation of the passing range designation signals 33 and 37 and the set allocation of the gains Gw (32) and Gc (35). Further, the allocation of the passing range designation signals 33 and 37 may be changed during the scanning exposure process to change the feedback mode.

Denoted at 38 is a table read-out synchronization signal. The number of pulses is counted by a counter (not shown) within a feed-forward (FF) table 39. In accordance with the pulse number as counted, a predetermined feed-forward data is read out of the feed-forward table 39 which data is supplied to a notional multiplier 29 together with an intensity designation signal 205 produced by the main control system 104. The output of the multiplier 29 is applied to an input of a notional adder C (36). The output of the adder C (36) provides a charge voltage signal 202 to the pulse laser light source 1.

Spike correction table 40 comprises correction data per time (per pulse) having been determined from transitional characteristic during non-control period, such as shown in FIG. 1, so as to cancel such transitional variation. It is set into the teed-forward table 39. Since the values in the feed-forward table 39 are so set as to correct any deviation with respect to a target intensity, due to the spike phenomenon, it is possible to make uniform the laser emission light intensity by multiplying the value in the feed-forward table 39 by the intensity designation value 205.

With the feed-forward mechanism such as described above, it is possible to reduce non-uniformness in integrated exposure amount due to the spike phenomenon.

In accordance with a similar concept, the value read out of the feed-forward table may be applied to the adder A (23), not to the multiplier 29. Alternatively, it may be applied to both of them. Since, however, for the feed-forward table to the adder A (23), the shape of intensity distribution in the illumination region should be considered as a parameter, a different table should be prepared.

Denoted at 50 and 51 are switches which are turned off when the spike waveform is measured during laser non-control period. From the data as measured in that period, an original feed-forward table may be prepared.

Figure 5:
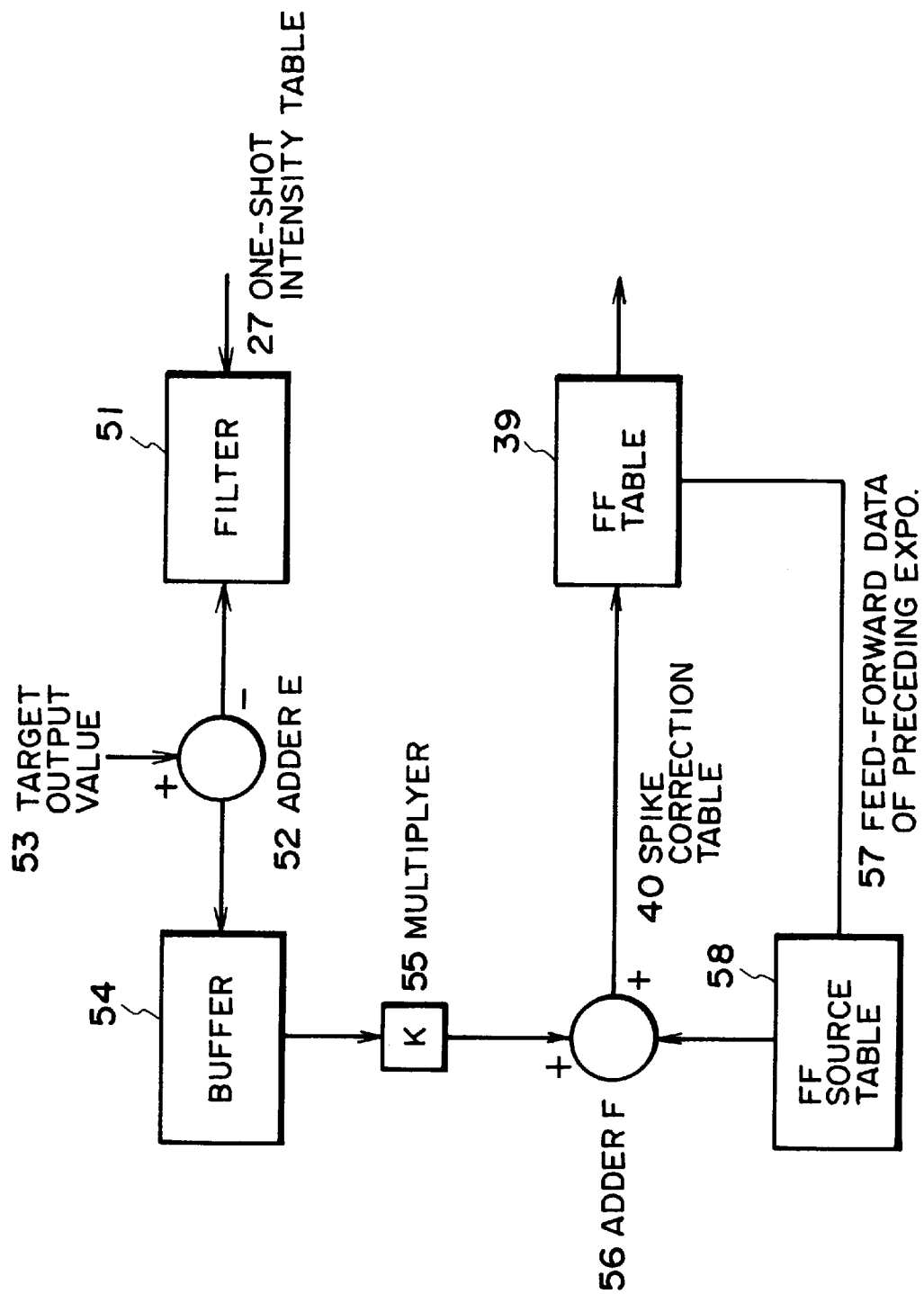
FIG. 5 is a schematic view for explaining an algorithm for preparing a spike correction table.

FIG. 5 illustrates an algorithm for preparing a feed-forward table for correction of spike phenomenon.

Figure 6:
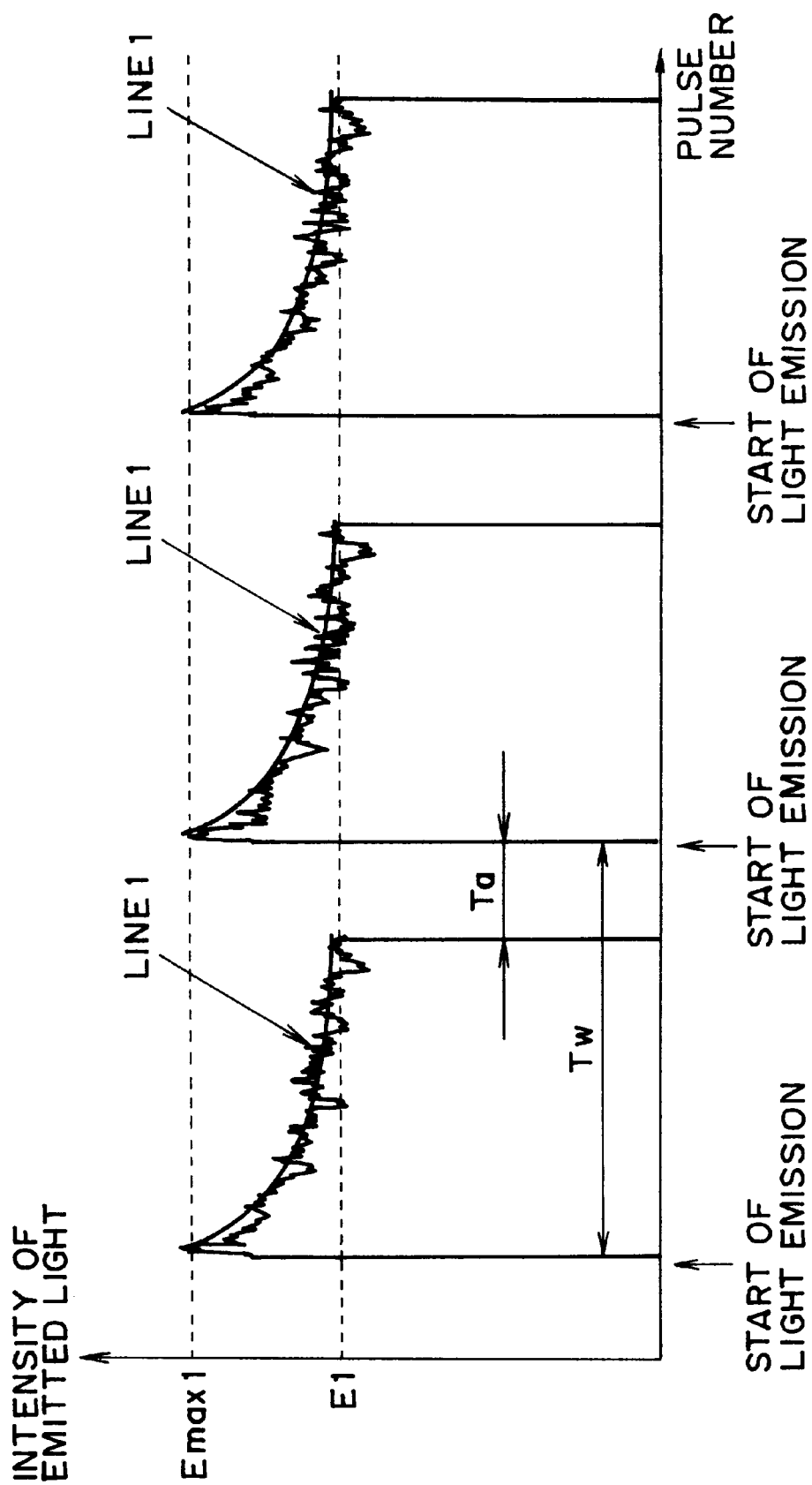
FIG. 6 is a graph for explaining transitional changes in intensity of emitted light from a laser source, operated in repetition of continuous emission, in relation to an attenuation curve (line 1).

The data on the emission light intensity as measured during one exposure process is read out of the cache memory 26 as a one-shot period intensity measurement table 27, and it is applied to an input of an adder E (52) through a filter 51. The filter 51 comprises a low pass filter for the intensity measurement data in the pulse axial direction. It serves to remove dispersion of emission light intensity of higher frequency component, out of the intensity measured data, as shown In FIG. 6, such that a profile as of a line 1 is extracted. The data applied to the adder E (52) is compared with a target output value 53 of the laser light source, and the result of subtraction is stored into a buffer 54. The data stored in the buffer 54 is multiplied by a predetermined magnification by a multiplier 55, and the resultant is supplied to an adder F (56).

On the other hand, the data stored in the feed-forward table 39 is once read out as a feed-forward data for correction of spike phenomenon of the pulse laser light source 1 and, thereafter, it is transferred to a feed-forward source table 58 as a feed-forward data 57 in the preceding exposure process. The data stored in the feed-forward source table 58 is then supplied to the adder F (56), for preparation of a fresh feed-forward table 39, and that the output of the adder 56 provides a fresh feed-forward table 39.

Next, another example of an algorithm for preparing a feed-forward table for correction of spike phenomenon, will be explained.

Figure 7:
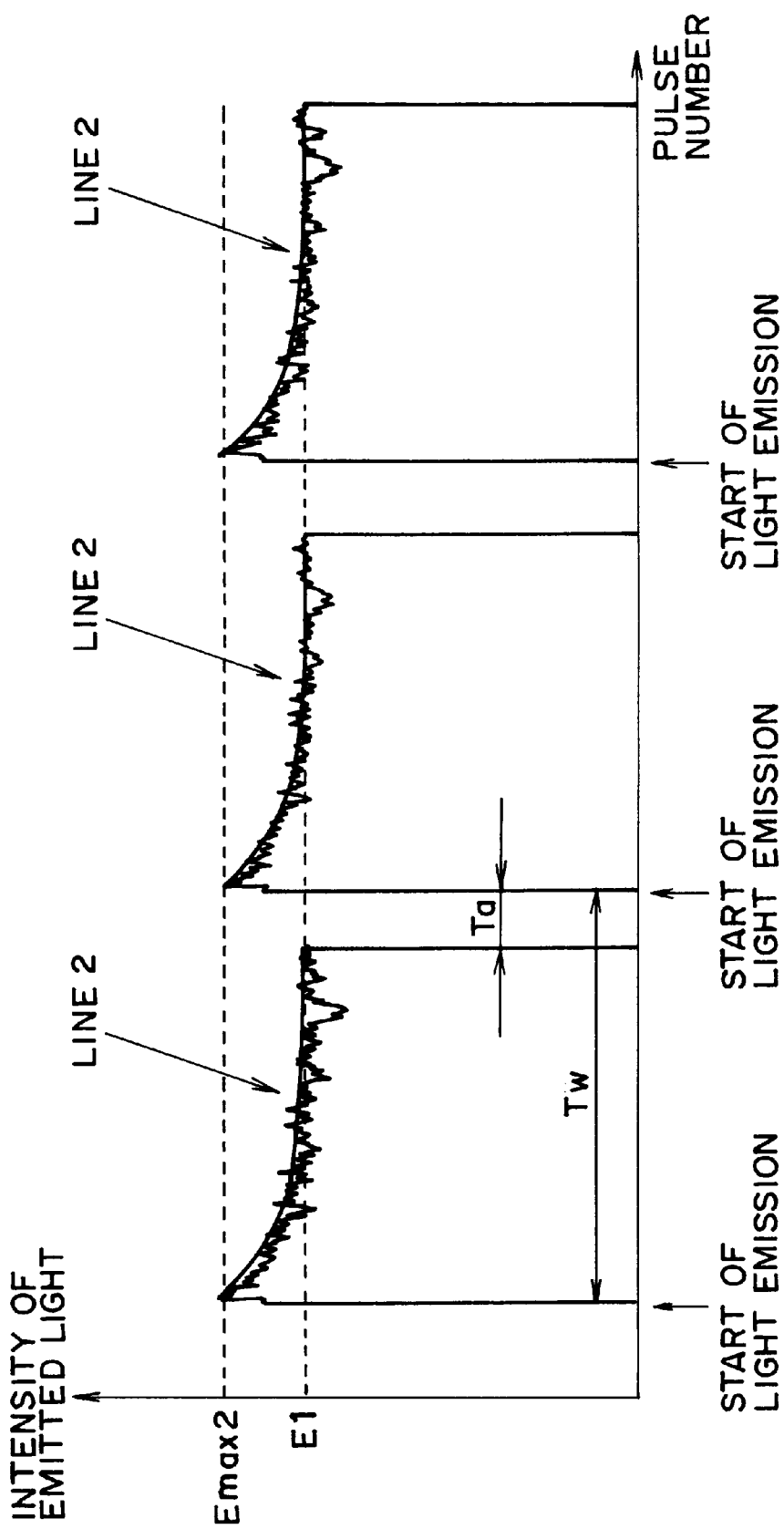
FIG. 7 is similar to FIG. 6 and it shows a graph for explaining transitional changes in intensity of emitted light from a laser source, operated in repetition of continuous emission, in relation to an attenuation curve (line 1).

FIGS. 6 and 7 each shows the relation between the pulse number and the emission light intensity, from start of light emission of a pulse laser light source 1 of this embodiment, which light source specifically comprises an excimer laser. The laser control amount (such as light emission interval or charge voltage, for example) as well as the time period (Tw) from start of current continuous light emission to start of subsequent continuous light emission, are the same and constant, in the examples of FIGS. 6 and 7. The only difference is that, in FIG. 6, the light emission interruption time is Ta while, in FIG. 7, it is Tb different from Ta. From the experiments made by the inventors, it has been confirmed that the height of the spike becomes higher with longer emission interruption time. That is, if Ta>Tb, Emax1>Emax2. Line 1 and line 2 are curves which represent spike shapes, as plural spike intensity characteristics being averaged.

Since the spike shape changes with the light emission interruption time as described, it is necessary that a feed-forward table prepared on the basis of a spike shape in the laser light source non-control period is corrected in accordance with the light emission interruption time to thereby prepare a feed-forward table. Additionally, temperature of the laser tube, integrated number of emitted light pulses of the laser, time of a single continuous light emission operation, light emission frequency and charge voltage, for example, may be considered as parameters affecting the feed-forward table.

Now, a formula for correction of the feed-forward table, as the continuous light emission time and the integrated number of emitted light pulses of a laser are considered as a table correction parameter group, will be explained.

If m(k) designates a measured value of emitted light intensity of a k-th pulse during the laser light source non-control period, IO denotes a designation value of emission light intensity during the laser light source non-control period, TO denotes the light emission interruption time in the laser light source non-control period, Tx denotes the light emission interruption time in the actual exposure operation, N denotes the integrated number of emitted light pulses of the laser, and Nm denotes the integrated number of emitted light pulses in the correction parameter measurement period, then the data of a k-th feed-forward table is such as follows:

$$C(k) = (IO/m(k)) \times ((TO/Tx)) \times \exp(-(N-Nm)/\tau)$$

where is a proportional constant as the correlation between the light emission interruption time and the height of spike is considered as a proportional relation, and $\tau$ is a time constant of intensity attenuation of the laser light source.

Figure 8:
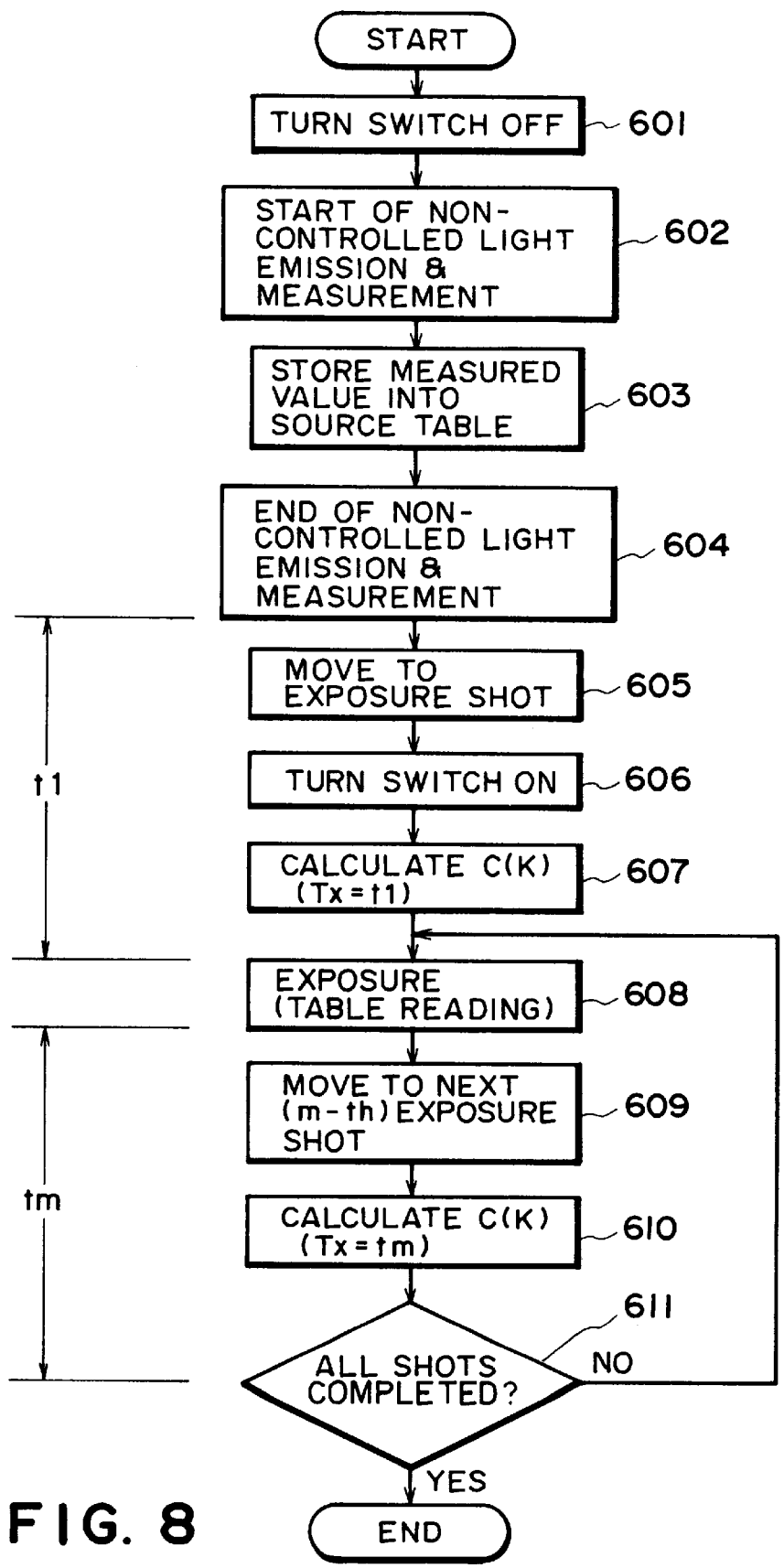
FIG. 8 is a flow chart for explaining an example of preparation of a feed-forward table.

FIG. 8 is a flow chart for preparing a feed-forward table, for correction of spike phenomenon.

Steps 601–604 are procedures for measuring the shape of spike in the laser light source non-control period. At step 601, the switches 50 and 51 are turned off. By this, a feedback signal generated by an illuminance monitor signal 203 and a feed-forward signal transmitted from a feed-forward table 39 are disconnected, such that the pulse laser light source I operates with a constant charge voltage and a constant light emission interval. At step 602, the light emission starts. The intensity of emitted light of each pulse is measured by the first exposure amount detector 14 or by the second exposure amount detector 15. At step 603, the measured light intensity is stored into a sequential cache memory 26. Light emission of the pulse laser light source 1 is performed until pulses necessary for scan exposure of one shot are provided. More specifically, as shown in FIG. 6 or 7, it is repeated plural times. If measurement with desired precision is completed, then at step 604 the light emission in the non-control period is finished.

At step 605, a reticle 9 and a wafer 12, are moved to the scan exposure start position, and exposure process for the wafer 12 starts. At step 606, the disconnected switches 50 and 51. are connected, such that feed-forward control and feedback control are enabled again. At step 607, data C(k) to be stored into the feed-forward table 39 is calculated in accordance with the aforementioned equation. Here, the light emission interruption time (e.g., Ta in FIG. 6) during measurement of spike shape in the laser light source non-control period may be substituted into the parameter TO. A predicted time t1 from the completion of procedure at step 604 to the moment just before start of exposure at step 608 may be substituted into the parameter Tx.

After the first shot, at step 609 the reticle 9 and the wafer 12 are moved to a position where the scan exposure for the subsequent shot can be started. At step 610, the time tm in which the light emission is interrupted until the subsequent exposure shot starts, is predicted, The result is substituted into the parameter Tx of C(k) . Time tm is variable in accordance with the position of the exposure shot upon the wafer 12. At step 611, discrimination is made as to whether the last shot is finished or not. If not, in the sequence goes back to step 608.

Figure 9:
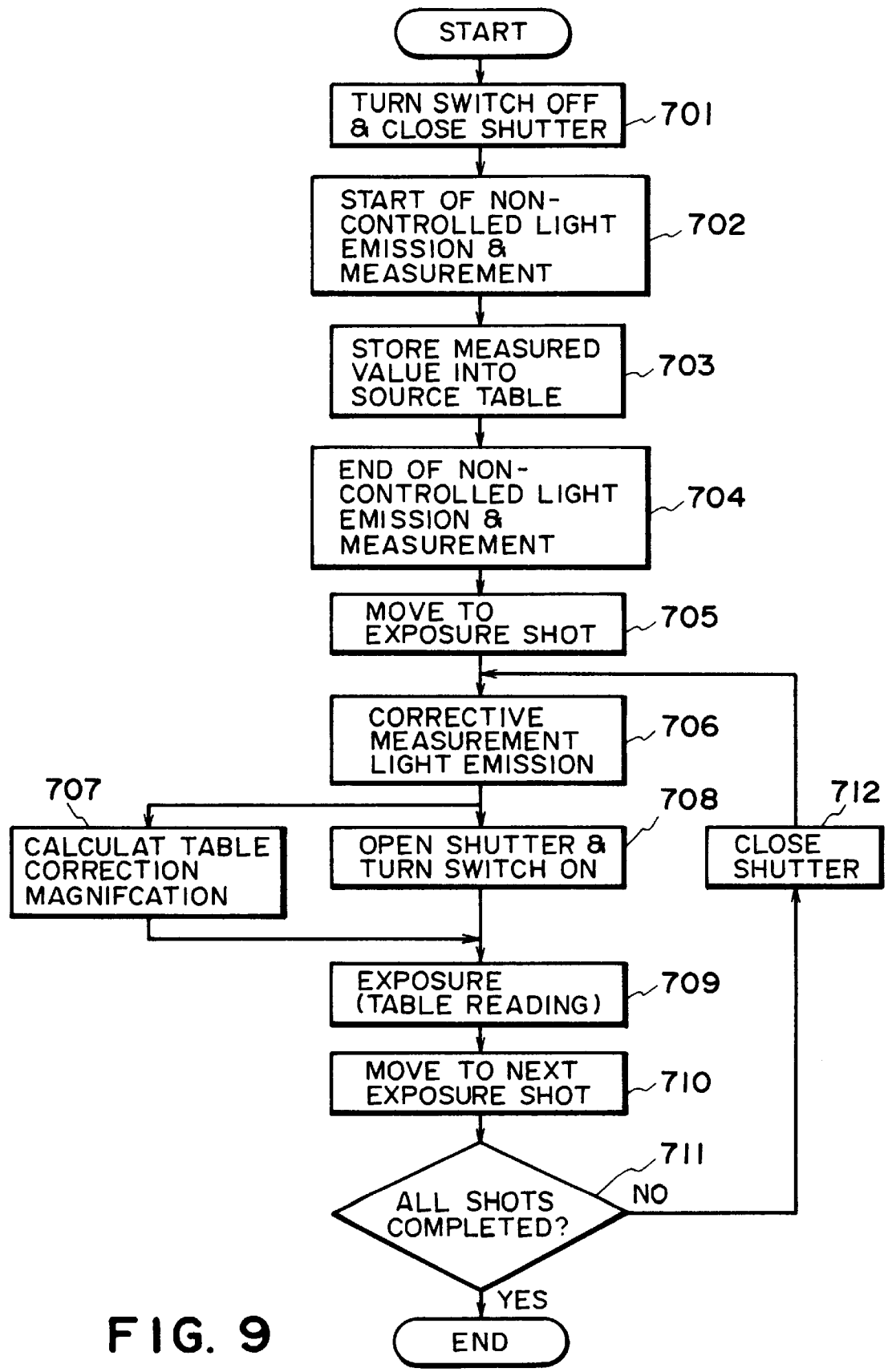
FIG. 9 is a flow chart for explaining another example of preparation of a feed-forward table.

FIG. 9 is a flow chart of another example of preparing a feed-forward table for correction or spoke phenomenon.

Steps 701–704 are the procedures for measuring the shape of spike in the laser light source non-control period, which are substantially the same as those at steps 601–604 of FIG. 6. The only difference is that, at step 701, the switches 50 and 51 are turned off and, simultaneously therewith, the high speed shutter 16 is closed. Thus, measurement of emitted light intensity is performed by means of the first exposure amount detector 14. From step 705, the wafer stage 14 and the reticle stage 13 are moved to tire scan exposure start position, and the wafer exposure process starts.

At step 706, laser light emission is executed under the condition that tile high speed shutter 16 is closed and, on the other hand, that the control is not performed. Light pulses of a predetermined number, that is, of a number with which the table correction magnification can be calculated at sufficient precision, are emitted. The intensity of emitted light is measured by the first exposure amount detector 14. At step 707, an approximation curve which represents emission light intensity measurement data having been measured at step 706 just before start of exposure, is determined. A table correction magnification for expanding or contracting the feed-forward table so that it substantially corresponds to the approximation curve, is calculated. By this, a corrected feed-forward table is prepared. Further, at step 703 and in parallel to step 707, the switches 50 and 51 are turned on and, simultaneously therewith, the high speed shutter 16 are opened. At step 709, scan exposure process is performed on the basis of a value read out from the feed-forward table. When the exposure process is completed, then at step 710 tile reticle 9 and the wafer 12 are moved to a position where the scan exposure for a subsequent exposure shot can be started. At step 711, discrimination is made as to whether the last shot is completed or not. If not, then at step 712 the high speed shutter 16 is closed, and the procedure from step 706 is repeated again.

In the mailer described above, the feed-forward data for spike correction is renewed successively. Thus, even if there occurs a change, with time, of the tube of the laser light source, for example, and the shape of spike changes, the spike correction table can follow that change automatically In the present invention, the feedback control and the feed-forward control are performed within the exposure apparatus. However, these controls may be performed within the pulse laser light source device itself. This applies to a second embodiment of the present invention, to be described below.

[Second Embodiment]

Now, a second embodiment of the present invention will be described.

Since the structure of the scanning exposure apparatus of this embodiment is basically the same as that of the first embodiment described with reference to FIG. 3, description of the same will be omitted.

Figure 10:
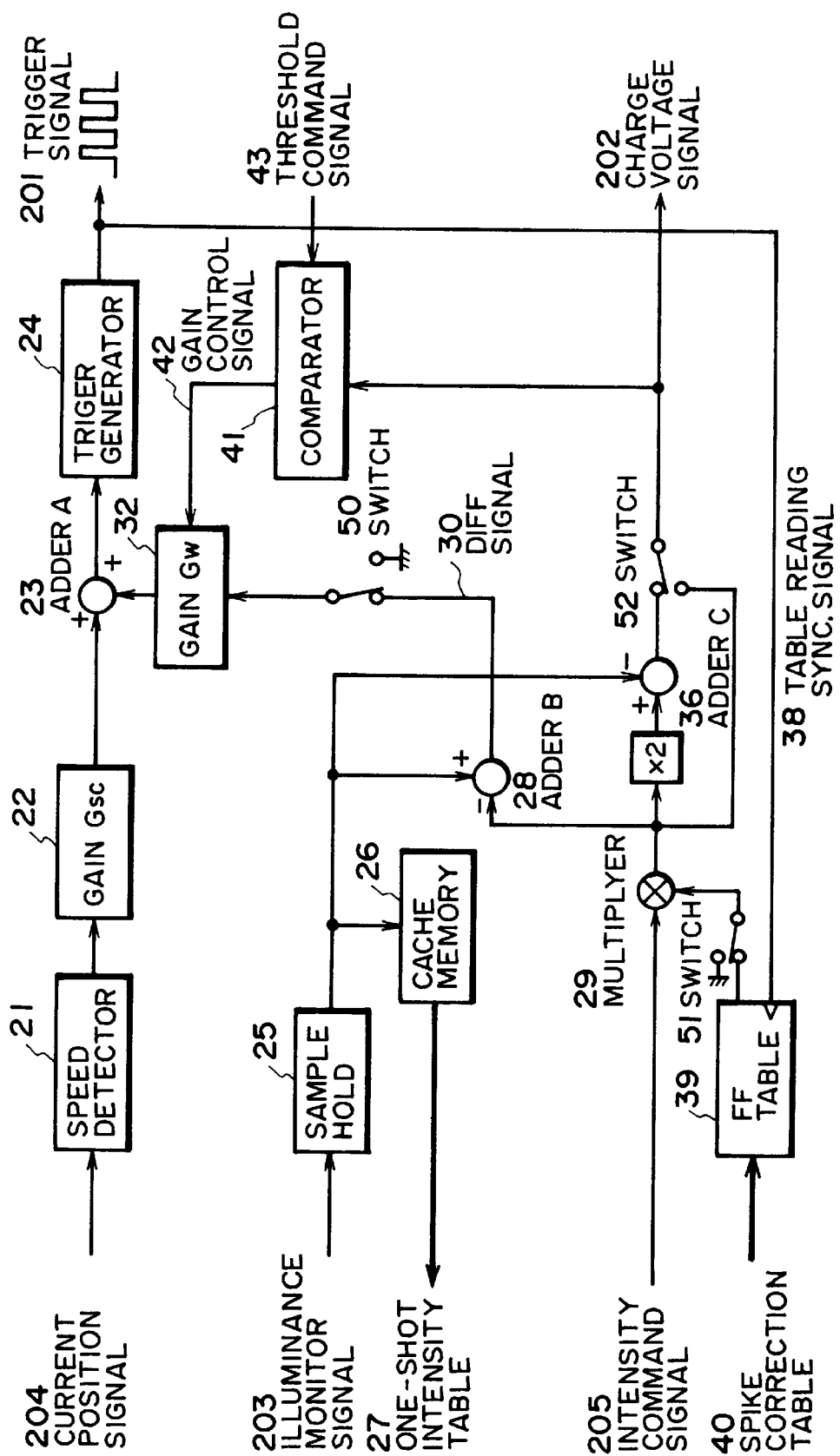
FIG. 10 is a diagrammatic view of a laser control system in an exposure apparatus according to a second embodiment of the present invention.

FIG. 10 schematically and diagrammatically illustrates a laser control system 103 of this embodiment. Like numerals as of FIG. 4 are assigned to elements corresponding to those of FIG. 4. Only distinctive features of the present embodiment to the first embodiment will now be explained.

The output of a sample hold circuit 25 is applied to an adder B (28) where a difference to the output of a multiplier 29 is taken. Thus, a differential signal 30 is produced. The differential signal 30 is multiplied by a gain Gw (32), and the resultant is applied to an adder A (23). The gain of the gain Gw (32) is controlled by a gain control signal 42 from a comparator 41. The comparator 41 serves to compare and monitor a charge voltage signal 202 and a threshold designation signal 43 (CO) supplied from the main control system 104, and it functions to change the gain in accordance with the charge voltage signal 202.

Figure 11:
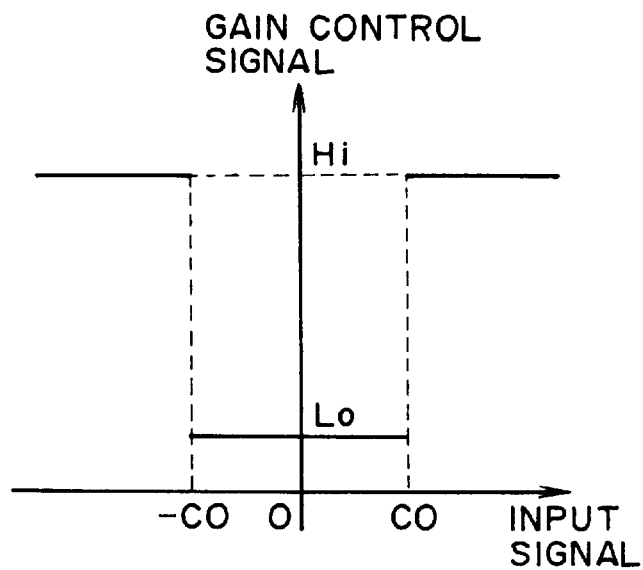
FIG. 11 is a graph for explaining input and output characteristics of a comparator of the second embodiment.

FIG. 11 illustrates an example of the relation between the input signal to the comparator 41 (charge voltage signal 202, in this embodiment) and the gain control signal 42. In this embodiment, the gain control signal 42 can take two levels of high (Hi) and low (Low). However, it is a possible alternative that the relation between the charge voltage signal 202 and the gain control signal 42 is changed along a continuous curve. Further, the allocation of the threshold designation signal 43 and the gain control signal 42 may be changed during the exposure process to thereby change the feedback mode.

In the present embodiment, as described above, the mixing proportion of emission light intensity control and light emission timing control is controlled on the basis of an absolute value of the charge voltage signal 202 which changes with the magnitude of difference to a target intensity, by which uniformization of non-uniform exposure can be accomplished.

Next, a feed-forward mechanism of this embodiment, for correction of spike phenomenon, will be explained.

In accordance with the number of pulses, a predetermined feed-forward data is read out of the feed-forward table 39. It is applied to a notional multiplier 29, together with an intensity designation signal 205 supplied from the main control system 104. The output of the multiplier 29 as doubled and the output of the sample hold circuit 25 in reversed phase are applied to an adder C (36). The output of the adder C (36) provides a charge voltage signal 202 to the pulse laser light source 1.

The feed-forward mechanism described above reduces or diminishes the spike phenomenon.

In accordance with a similar concept, the value read out of the feed-forward table may be applied to the adder A (23), not to the multiplier 29. Alternatively, it may be applied to both of them.

The algorithm for preparation of a spike correction table may be the same as that of the first embodiment. However, it is to be noted that, for measurement of spike waveform in the laser light source non-control period, the switch 52 should be changed oppositely to the example of FIG. 10 so that the intensity designation signal 205 directly provides a charge voltage signal 202.

[Third Embodiment]

A third embodiment of the present invention will now be described.

Since the structure of a scan type exposure apparatus according to this embodiment is basically the same as that of the first embodiment shown in FIG. 3, description there of will be omitted.

Figure 12:
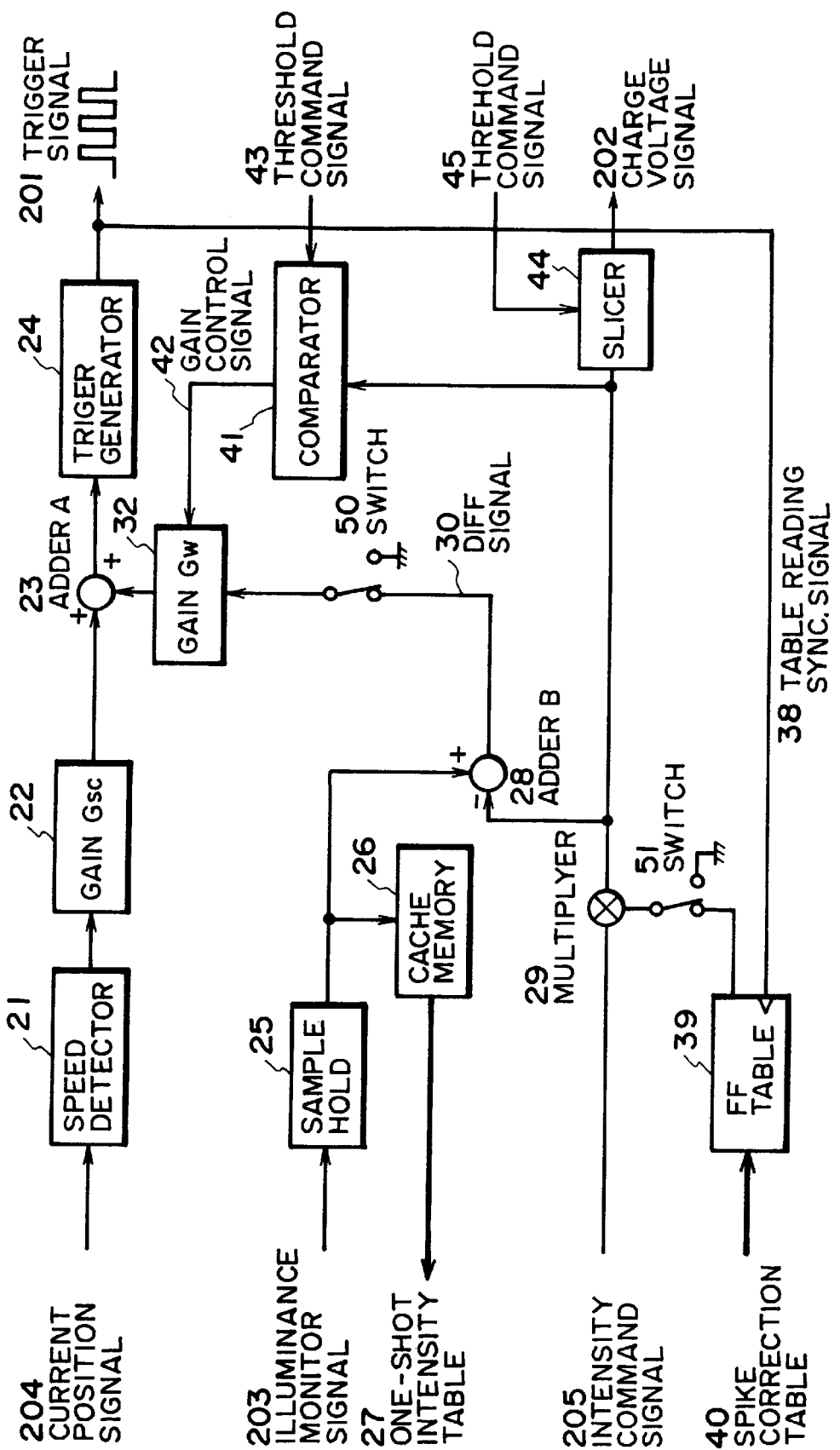
FIG. 12 is a diagrammatic view of a laser control system of an exposure apparatus according to a third embodiment of the present invention.

FIG. 12 schematically and diagrammatically illustrates a laser control system 103 of this embodiment. Like numerals as of those of the first or second embodiment are assigned to elements corresponding to those of the first or second embodiment. Only distinctive features of the present embodiment will be explained below.

Figure 13:
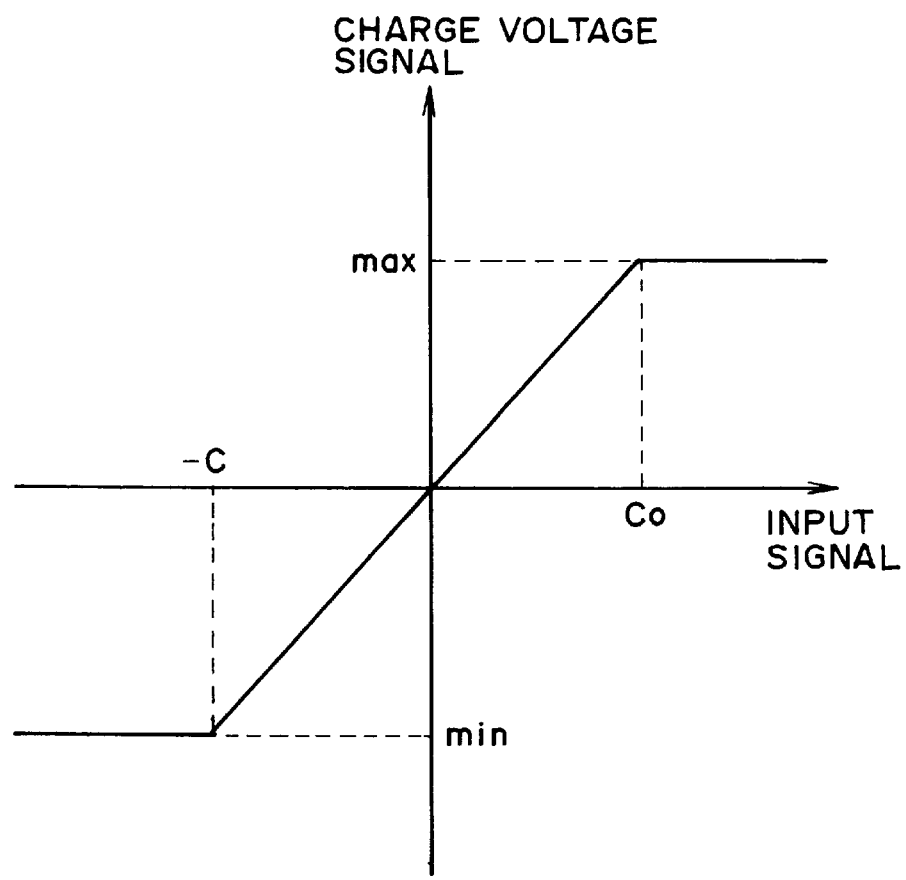
FIG. 13 is a graph for explaining input and output characteristics of a slicer of the third embodiment.

The present embodiment differs from the second embodiment in the point that the charge voltage signal 202 is controlled by means of a slicer 44. The slicer 44 has such input/output relation as shown in FIG. 13. The threshold value is determined by a threshold designation signal 45 from the main control system 104.

As regards the control of light emission interval, in the second embodiment the signal to be applied to the comparator 41 is the charge voltage signal 202, whereas in the present embodiment the output signal from the adder C (29) is applied, which signal is compared with the threshold designation signal 43 whereby a gain control signal 42 is produced. The relation between the input signal to the comparator 41 (the output signal of the adder C (29), in this embodiment) and the gain control signal 42 is the same as that of the second embodiment as shown in FIG. 11. Further, the feedback mechanism for the adder A (23) is the same as that of the second embodiment.

While in this embodiment the threshold designation signals 43 and 45 have the same level, they may have different levels.

With the feedback mechanism and feed-forward mechanism of the present embodiment, it is possible to uniform the exposure non-uniformness.

Further, like the first and second embodiments, the value read out of the feed-forward table may be applied to the adder A (23), not to tile multiplier 29. It may be applied to both of them.

The algorithm for preparation of spike correction table may be the same as that of the first embodiment.

[Fourth Embodiment]

A fourth embodiment of the present invention will now be described.

Since tile structure of a scan type exposure apparatus according to this embodiment is basically the same as that of the first embodiment described with reference to FIG. 3, description thereof will be omitted.

Figure 14:
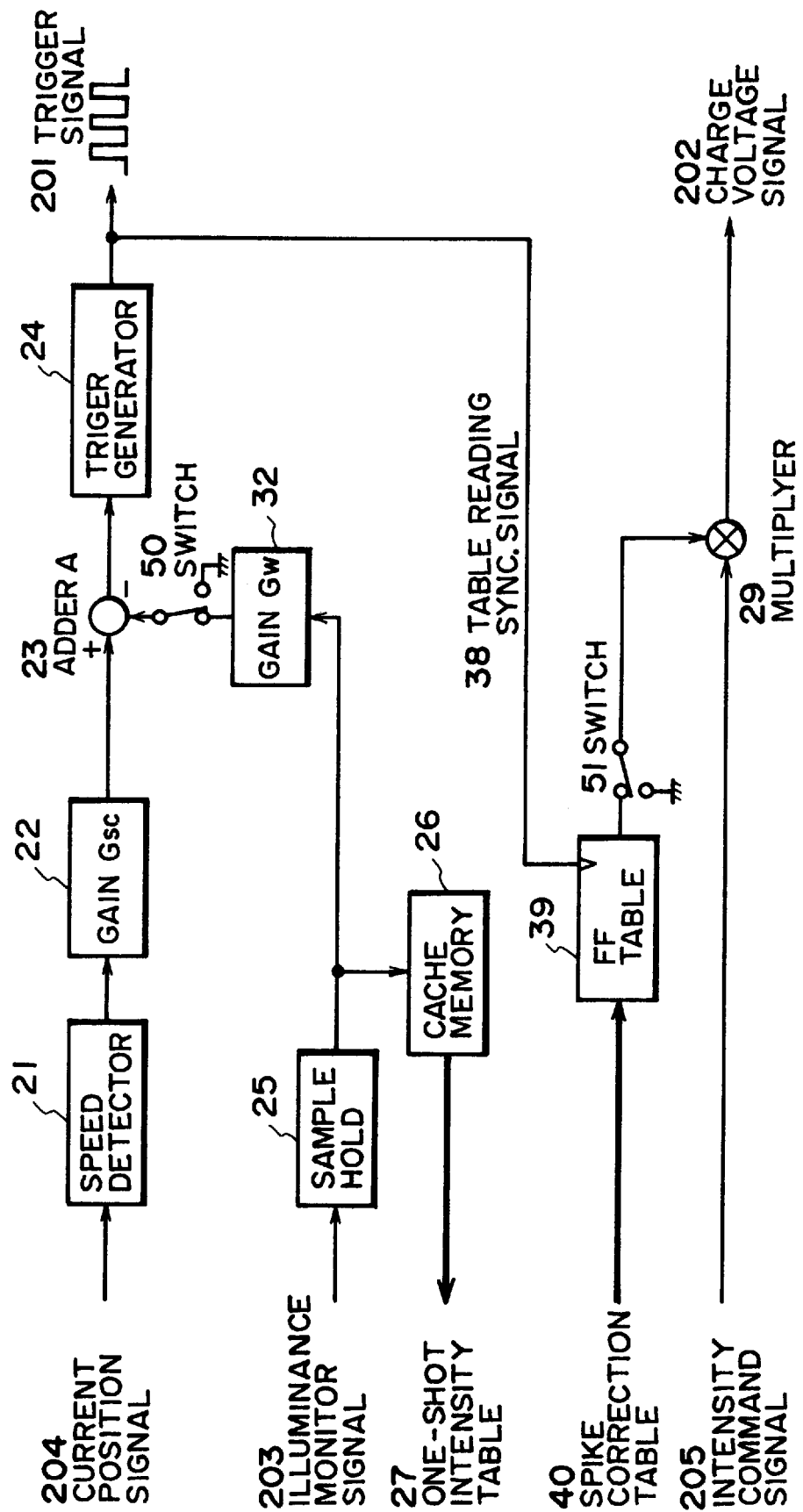
FIG. 14 is a diagrammatic view of a laser control system of an exposure apparatus according to a fourth embodiment of the present invention.

FIG. 14 schematically and diagrammatically illustrates a laser control system 103 of this embodiment. Like numerals as of those of the first, second or third embodiment are assigned to corresponding elements. Only distinctive features of the present embodiment will be explained below.

In this embodiment, only the light emission timing control is equipped with a feedback mechanism, and the light emission timing control and the emission light intensity control are performed independently. Non-uniformness of exposure can be made uniform even with this arrangement. As a matter of course, similar advantageous results are attainable with an arrangement, opposite to that of the present embodiment, wherein the light emission timing control is equipped with a feed-forward mechanism while the emission light intensity control is equipped with a feedback mechanism.

The algorithm for preparation of a spike correction table may be the sane as that of the first embodiment.

While in the first to fourth embodiments the invention has been described with reference to a scan type exposure apparatus, the present invention is applicable also to a non-scan type exposure apparatus such as a stepper. Further, the present invention is not limited to application to an exposure apparatus, but it is applicable also to an illumination system or a processing apparatus having a pulse laser light source, with an advantageous result of reduction of non-uniformness in illumination or processing.

[Fifth Embodiment]

Now, an embodiment of a semiconductor device manufacturing method which uses an exposure apparatus according to any one of the preceding embodiments, will be described.

Figure 15:
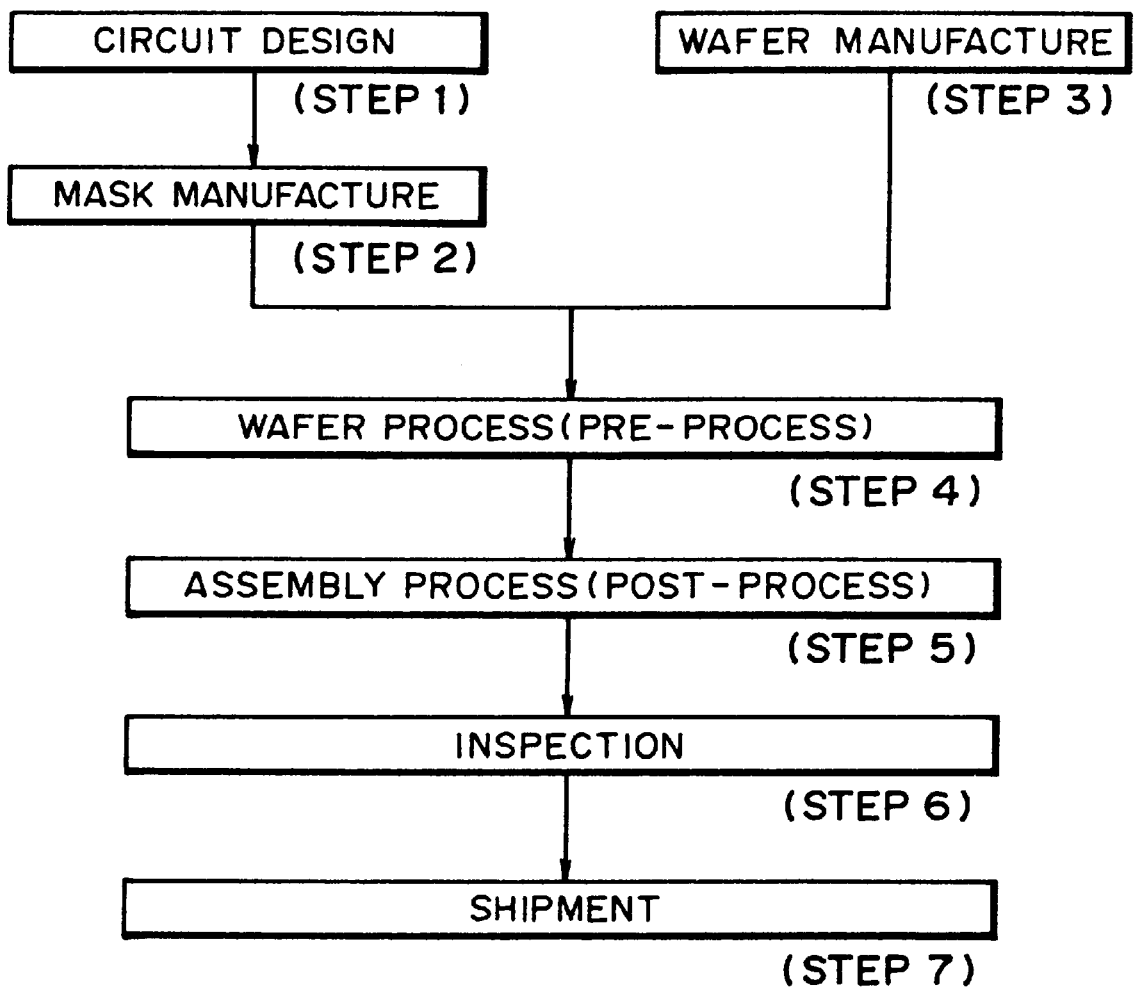
FIG. 15 is a flow chart of semiconductor device manufacturing processes

FIG. 15 is a flow chart of the sequence of manufacturing a semiconductor device such as a semiconductor chip (e.g. IC or LSI) or a liquid crystal panel, for example. Step 1 is a design process for designing the circuit of a semiconductor device. Step 2 is a process for manufacturing a mask on the basis of the circuit pattern design. Step 3 is a process for manufacturing a wafer by using a material such as silicon.

Step 4 is a wafer process which is called a pre-process wherein, by using the so prepared mask and wafer, circuits are practically formed on the water through lithography. Step 5 subsequent to this is an assembling step which is called a post-process wherein the wafer processed by step 4 is formed into semiconductor chips. This step includes assembling (dicing and bonding) and packaging (chip sealing). Step 6 is an inspection step wherein operability check, durability check and so on of the semiconductor devices produced by step 5 are carried out- With these processes, semiconductor devices are finished and they are shipped (step 7).

Figure 16:
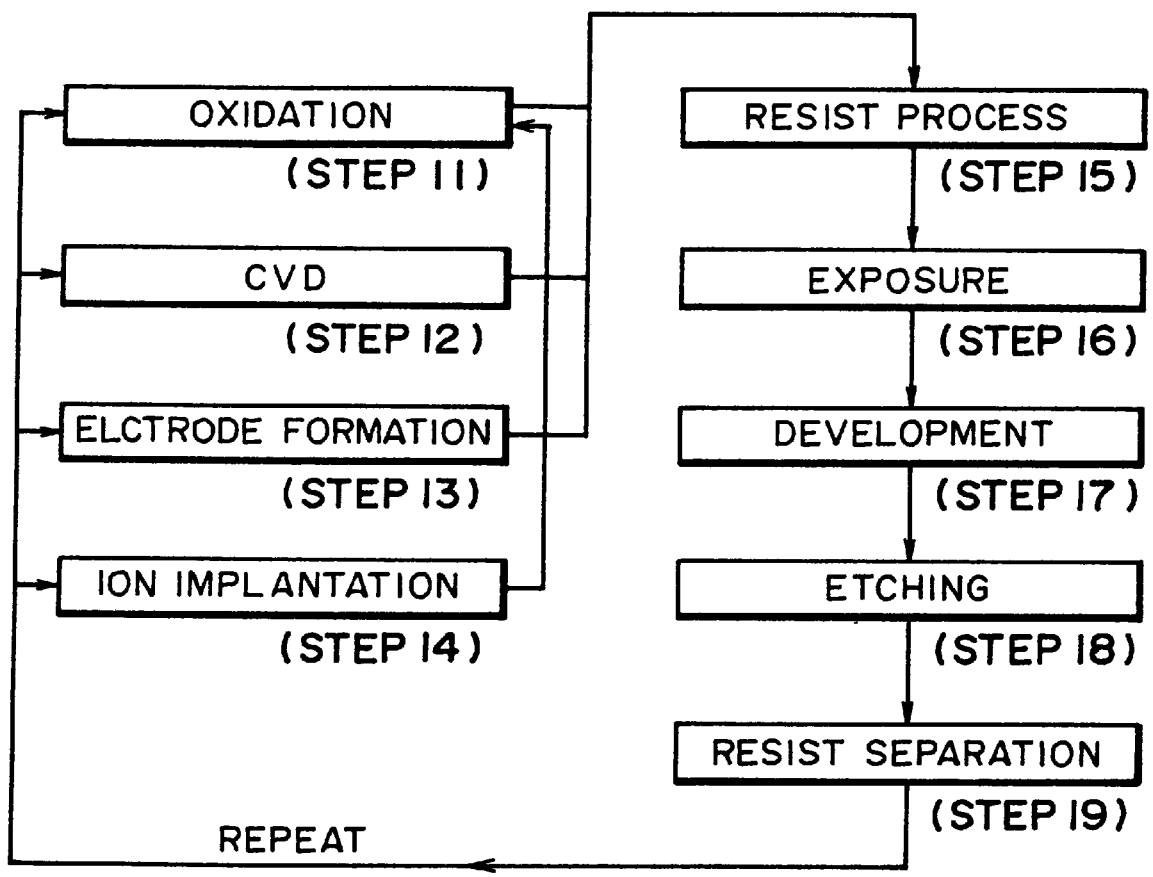
FIG. 16 is a flow chart for explaining details of a wafer process in the flow of FIG. 15.

FIG. 16 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes on the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are supposedly formed on the wafer.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:

a pulse light source for producing pulses of light, wherein, for scan exposure of a substrate through an original, a plurality of light pulses from said pulse light source are projected through the original to the substrate;

light emission intensity changing means for changing an emitted light intensity of light pulses from said pulse light source during the scan exposure;

light emission timing changing means for changing timing of light emission from said pulse light source during the scan exposure; and light intensity detecting means for detecting light intensity of a current light pulse, wherein said light emission intensity changing means and said light emission timing changing means are used selectively in accordance with a frequency component of variation in intensity of emitted light, which is based on the detection by said light intensity detecting means, so as to change at least one of the emitted light intensity and the timing of light emission of a subsequent light pulse.

2. An apparatus according to claim 1, further comprising light intensity predicting means for predicting light intensity of a subsequent light pulse, wherein said light emission intensity changing means changes the light intensity of the subsequent light pulse on the basis of the prediction by said light intensity predicting means.

3. An apparatus according to claim 2, further comprising light intensity detecting means for detecting light intensity of a current pulse, wherein a value predicted by said light intensity predicting means is renewed on the basis of the detection by said light intensity detecting means.

4. An apparatus according to claim 1, further comprising light intensity predicting means for predicting light intensity of a subsequent light pulse, wherein said light emission timing changing means changes the timing of light emission of the subsequent light pulse on the basis of the prediction by said light intensity predicting means.

5. An apparatus according to claim 4, further comprising light intensity detecting means for detecting light intensity of a current light pulse, wherein a value predicted by said light intensity predicting means is renewed on the basis of the result of detection by said light intensity detecting means.

6. An apparatus according to claim 1, wherein said light emission intensity changing means changes the emitted light intensity by changing a charge voltage to said pulse light source.

7. An apparatus according to claim 1, wherein said pulse light source comprises an excimer laser.

8. An apparatus according to claim 1, further comprising a mask having a pattern, wherein the pattern of said mask is to be transferred by exposure onto the substrate, and scanning means for scanning moving said mask and the substrate relatively to light pulses.

9. A pulse light source for producing pulses of light which, for scan exposure of a substrate through an original, are projected through the original to the substrate, said pulse light source comprising:

light emission intensity changing means for changing an emitted light intensity of light pulses from said pulse light source during the scan exposure;

light emission timing changing means for changing timing of light emission from said pulse light source during the scan exposure; and light intensity detecting means for detecting light intensity of a current light pulse, wherein said light emission intensity changing means and said light emission timing changing means are used selectively in accordance with a frequency component of variation in intensity of emitted light, which is based on the detection by said light intensity detecting means, so as to change at least one of the emitted light intensity and the timing of light emission of a subsequent light pulse.

10. A pulse light source according to claim 9, further comprising light intensity predicting means for predicting light intensity of a subsequent light pulse, wherein said light emission intensity changing means changes the emitted light intensity of the subsequent light pulse on the basis of the prediction by said light intensity predicting means.

11. A pulse light source according to claim 10, further comprising light intensity detecting means for detecting light intensity of a current pulse, wherein a value predicted by said light intensity predicting means is renewed on the basis of the detection by said light intensity detecting means.

12. A pulse light source according to claim 9, further comprising light intensity predicting means for predicting light intensity of a subsequent light pulse, wherein said light emission timing changing means changes the timing of light emission of the subsequent light pulse on the basis of the prediction by said light intensity predicting means.

13. A pulse light source according to claim 12, further comprising light intensity detecting means for detecting light intensity of a current light pulse, wherein a value predicted by said light intensity predicting means is renewed on the basis of the result of detection by said light intensity detecting means.

14. A pulse light source according to claim 9, wherein said light emission intensity changing means changes the emitted light intensity by changing a charge voltage to said pulse light source.

15. A pulse light source according to claim 9, wherein said pulse light source comprises an excimer laser.

16. A device manufacturing method, comprising the steps of:

projecting, for scan exposure of a substrate through an original, a plurality of light pulses from a pulse light source to the substrate through the original;

changing, with light emission intensity changing means, an emitted light intensity of light pulses from the pulse light source during the scan exposure;

changing, with light emission timing changing means, timing of light emission from the pulse light source during the scan exposure; and detecting light intensity of a current light pulse, wherein said steps of changing the emitted light intensity and changing the timing of light emission respectively change at least one of the emitted light intensity and the timing of light emission of a subsequent light pulse, in accordance with a frequency component of variation of light intensity of emitted light, which is based on said detection of the light intensity of the current light pulse.

17. A method according to claim 16, further comprising predicting light intensity of a subsequent light pulse, wherein said step of changing the emitted light intensity changes the emitted light intensity of the subsequent light pulse on the basis of said prediction.

18. A method according to claim 17, further comprising detecting light intensity of a current light pulse and renewing a predicted value of light intensity on the basis of said detection of the light intensity.

19. A method according to claim 16, further comprising predicting light intensity of a subsequent light pulse, wherein said step of changing the timing of light emission changes the timing of light emission of the subsequent light pulse on the basis of a predicted value of the light intensity.

20. A method according to claim 19, further comprising detecting light intensity of a current light pulse and renewing a predicted value of the light intensity on the basis of said detection of the light intensity.

21. A method according to claim 16, further comprising scanning moving a mask having a pattern and a substrate to which the pattern of the mask is to be transferred, relatively to light pulses.

* * * * *

UNITED STATES PATENT AND TRADEMARK OFFICE
CERTIFICATE OF CORRECTION

PATENT NO. : 5,914,773

DATED : June 22, 1999

INVENTOR(S): HIROSHI KUROSAWA, ET AL.

It is certified that error appears in the above-identified patent and that said Letters Patent is hereby corrected as shown below:

ON THE COVER PAGE AT ITEM [56] U.S. PATENT DOCUMENTS:
"451,692 5/1891 Michalik" and "5,484,311 1/1996 Sakakibara et al." should respectively read --4,519,692 5/1985 Michalik-- and --5,483,311 1/1999 Sakakibara et al.--.

IN THE DRAWINGS:

FIGURE 4,
In box 24, "TRIGER" should read --TRIGGER--.

FIGURE 10,
In box 24, "TRIGER" should read --TRIGGER--.

FIGURE 12,
In box 24, "TRIGER" should read --TRIGGER--.

FIGURE 14,
In box 24, "TRIGER" should read --TRIGGER--.

UNITED STATES PATENT AND TRADEMARK OFFICE
CERTIFICATE OF CORRECTION

PATENT NO. : 5,914,773

DATED : June 22, 1999

INVENTOR(S): HIROSHI KUROSAWA, ET AL.

It is certified that error appears in the above-identified patent and that said Letters Patent is hereby corrected as shown below:

IN THE DISCLOSURE:

COLUMN 1,
Line 56, "spire" should read --spike--.

COLUMN 2,
Line 19, "Invention" should read --invention--. COLUMN 3,
Line 36, "processes FIG. 16" should read --processes. ¶ FIG. 16--.

COLUMN 3,
Line 36, "processes FIG. 16" should read --processes. ¶ FIG. 16--.

COLUMN 4,
Line 18, "arid" should read --and--.

COLUMN 5,
Line 6, "in" should be deleted.

COLUMN 6,
Line 17, "In" should read --in--.

UNITED STATES PATENT AND TRADEMARK OFFICE
CERTIFICATE OF CORRECTION

PATENT NO. : 5,914,773

DATED : June 22, 1999

INVENTOR(S): HIROSHI KUROSAWA, ET AL.

It is certified that error appears in the above-identified patent and that said Letters Patent is hereby corrected as shown below:

COLUMN 7,
Line 13, "In the equation, "((TO/Tx))" should read --($\alpha$(TO/Tx));
Line 15, "where" should read --where $\alpha$--;
Line 28, "source I" should read --source 1--;
Line 35, "pul ses" should read --pulses--; and
Line 61, "in" should be deleted.

COLUMN 8,
Line 6, "tire" should read --the--;
Line 8, "tile" should read --the--;
Line 26, "tile" should read --the--;
Line 32, "mailer" should read --manner--; and
Line 36, "automatically" should read --automatically,--.

COLUMN 10,
Line 13, "tile" should read --the--; and
Line 65, "water" should read --wafer--.

COLUMN 11,
Line 5, "out-" should read --out.--.

UNITED STATES PATENT AND TRADEMARK OFFICE
CERTIFICATE OF CORRECTION

PATENT NO. : 5,914,773

DATED : June 22, 1999

INVENTOR(S): HIROSHI KUROSAWA, ET AL.

It is certified that error appears in the above-identified patent and that said Letters Patent is hereby corrected as shown below:

COLUMN 12,
Line 18, "scanning" should read --scanningly--.

COLUMN 14,
Line 19, "scanning" should read --scanningly--.

Signed and Sealed this

Twenty-seventh Day of June, 2000

Attest:

Q. TODD DICKINSON

Attesting Officer

Director of Patents and Trademarks